United States Patent
Wang et al.

(10) Patent No.: US 12,133,406 B2
(45) Date of Patent: Oct. 29, 2024

(54) DISPLAY PANEL INCLUDING RING-SHAPED RETAINING WALLS, DISPLAY DEVICE, DISPLAY PANEL, AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Yijia Wang, Hubei (CN); Bo Yan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 948 days.

(21) Appl. No.: 16/971,203

(22) PCT Filed: Jul. 24, 2020

(86) PCT No.: PCT/CN2020/104460
§ 371 (c)(1),
(2) Date: Aug. 19, 2020

(87) PCT Pub. No.: WO2022/007019
PCT Pub. Date: Jan. 13, 2022

(65) Prior Publication Data
US 2023/0098291 A1    Mar. 30, 2023

(30) Foreign Application Priority Data
Jul. 7, 2020  (CN) .......................... 202010645056.8

(51) Int. Cl.
*H10K 50/84*    (2023.01)
*H10K 59/12*    (2023.01)
(Continued)

(52) U.S. Cl.
CPC ............. *H10K 50/84* (2023.02); *H10K 59/12* (2023.02); *H10K 59/40* (2023.02); *H10K 71/00* (2023.02);
(Continued)

(58) Field of Classification Search
CPC ...... H10K 50/84; H10K 50/844; H10K 59/12; H10K 59/40; H10K 59/65; H10K 59/873; H10K 59/122
See application file for complete search history.

(56) References Cited

U.S. PATENT DOCUMENTS 10,748,974 B2* 8/2020 Lee .................... G06F 1/1626
10,868,102 B1* 12/2020 Zhang ................ H10K 59/131
(Continued)

FOREIGN PATENT DOCUMENTS

| CN | 106450038 A | 2/2017 |
| CN | 106887523 A | 6/2017 |

(Continued)

*Primary Examiner* — Ida M Soward

(57) ABSTRACT

A display panel includes an opening area, a peripheral area surrounding at least a part of the opening area, and a display area. The display panel further includes: a thin film transistor substrate; a plurality of ring-shaped retaining walls disposed on a part of the thin film transistor substrate corresponding to the peripheral area, and disposed around the opening area; and a filling layer disposed in the peripheral area. Any one of the ring-shaped retaining walls is provided with at least an opening.

8 Claims, 7 Drawing Sheets

(51) Int. Cl.
    *H10K 59/40*         (2023.01)
    *H10K 71/00*         (2023.01)
    *H10K 50/844*       (2023.01)

(52) U.S. Cl.
    CPC ....... *H10K 50/844* (2023.02); *H10K 59/1201* (2023.02)

(56) References Cited

U.S. PATENT DOCUMENTS

| | | | |
|---|---|---|---|
| 11,158,687 B2 * | 10/2021 | Choi | H10K 50/844 |
| 2020/0006700 A1 * | 1/2020 | Kim | H10K 59/60 |
| 2020/0075700 A1 * | 3/2020 | Cao | H10K 59/1213 |
| 2020/0235333 A1 * | 7/2020 | Sung | H10K 50/844 |
| 2020/0295102 A1 * | 9/2020 | Qin | H10K 71/00 |
| 2021/0020866 A1 | 1/2021 | Choi et al. | |
| 2021/0066649 A1 * | 3/2021 | Wang | H04M 1/0268 |
| 2021/0210713 A1 * | 7/2021 | Li | H10K 59/131 |
| 2021/0336208 A1 * | 10/2021 | Liu | H10K 77/111 |
| 2021/0408458 A1 * | 12/2021 | Lu | H10K 50/844 |
| 2022/0367584 A1 * | 11/2022 | Lee | H10K 50/8445 |

FOREIGN PATENT DOCUMENTS

| | | | | |
|---|---|---|---|---|
| CN | 109256487 A | * | 1/2019 | ......... H01L 27/1218 |
| CN | 110148683 A | * | 8/2019 | ......... H01L 27/3246 |
| CN | 110416435 A | | 11/2019 | |
| CN | 110634928 A | * | 12/2019 | ............. H10K 59/60 |
| CN | 110660828 A | | 1/2020 | |
| CN | 110718640 A | * | 1/2020 | ........... H10K 50/844 |
| CN | 110783388 A | * | 2/2020 | ......... H01L 27/3234 |
| CN | 110854304 A | | 2/2020 | |
| CN | 110875440 A | | 3/2020 | |
| CN | 111276630 A | * | 6/2020 | ......... H01L 27/3241 |
| CN | 111326674 A | | 6/2020 | |

\* cited by examiner

| forming a thin film transistor substrate; |—S1

| forming a protective layer and a photoresist layer in sequence, wherein the protective layer and the photoresist layer are disposed on parts of the thin film transistor substrate corresponding to the display area and the peripheral area; |—S2

| forming a plurality of ring-shaped retaining walls on the part of the thin film transistor substrate corresponding to the peripheral area and around the opening area, wherein any one of the ring-shaped retaining walls is provided with at least an opening; and |—S3

| peeling off the photoresist layer and the protective layer; |—S4

| forming a light-emitting functional layer on the part of the thin film transistor corresponding to the display area; and |—S5

| forming a filling layer in the peripheral area. |—S6

FIG. 6

DISPLAY PANEL INCLUDING RING-SHAPED RETAINING WALLS, DISPLAY DEVICE, DISPLAY PANEL, AND MANUFACTURING METHOD THEREOF

BACKGROUND OF INVENTION

Field of Invention

The present invention relates to the field of display technology, in particular to a display device, a display panel, and a manufacturing method thereof.

Description of Prior Art

Organic light-emitting diode (OLED) display devices are favored by consumers and developers due to their advantages of self-luminescence, high contrast, wide viewing angles, low power consumption, and flexibility. Flexible OLED display devices are gradually occupying the market because of their flexibility, lightness and thinness. Screens of high screen-to-body ratio to even full screens have also become the focus of industry and academia. In addition to a display area of a display device, components such as a camera, earpiece, and microphone also occupy a certain screen-to-body ratio. In order to increase the screen-to-body ratio of the display device, the current common method is to use laser cutting technology to place the camera in the display area. However, after laser cutting in the display area, water and oxygen will directly invade laterally along a cathode. In order to prevent the display device from being permeated by water and oxygen, a method of using a groove with an undercut is proposed to effectively block the lateral invasion of water and oxygen.

Thinning and flexibility of the device is the mainstream development direction of the display industry. In order to reduce the thickness of the display device, most developers currently directly prepare a touch functional layer on an encapsulation layer. Considering that metal traces in the touch functional layer are likely to cause short circuit when they are prepared on a substrate with grooves, the grooves need to be filled. However, gas tends to accumulate in the grooves during a filling process, resulting in uneven coating due to accumulation of the gas in the grooves during subsequent coating.

Therefore, there is a need to propose a new technical solution to solve the above technical problem.

SUMMARY OF INVENTION

Embodiments of the present invention provide a display device, a display panel, and a manufacturing method thereof, to improve phenomenon of uneven coating caused by gas accumulation in the groove during a coating process.

An embodiment of the present invention provides a display panel, including an opening area, a peripheral area surrounding at least a part of the opening area, and a display area, wherein the display panel further includes:
a thin film transistor substrate;
a plurality of ring-shaped retaining walls disposed on a part of the thin film transistor substrate corresponding to the peripheral area, and disposed around the opening area, wherein any one of the ring-shaped retaining walls is provided with at least an opening; and
a filling layer disposed in the peripheral area.

In the display panel provided by an embodiment of the present invention, the ring-shaped retaining walls include:
a first ring-shaped retaining wall including at least one first opening and surrounding the opening area; and
a second ring-shaped retaining wall including at least one second opening and surrounding the first ring-shaped retaining wall,
wherein at least a part of the second opening corresponds to the first opening, or the second opening and the first opening are staggered to each other.

In the display panel provided by an embodiment of the present invention, a ring-shaped groove is defined between adjacent ones of the ring-shaped retaining walls, and the ring-shaped retaining walls and the ring-shaped groove are communicated with each other through the opening.

In the display panel provided by an embodiment of the present invention, the ring-shaped retaining walls has a T-shaped cross-section.

In the display panel provided by an embodiment of the present invention, an angle formed between an inclined surface of the ring-shaped groove and a vertical direction of the ring-shaped groove is greater than 90 degrees and less than 180 degrees.

In the display panel provided by an embodiment of the present invention, the thin film transistor substrate includes:
a substrate;
a buffer layer disposed on the substrate;
a switch component disposed in the display area and including an active layer, a first gate, a source, and a drain;
an insulating layer disposed in the display area and the peripheral area and at least including a first gate insulating layer and an interlayer insulating layer which are disposed on the active layer; and
a passivation layer covering the insulating layer.

In the display panel provided by an embodiment of the present invention, the ring-shaped retaining walls are formed by patterning the passivation layer and the insulating layer.

In the display panel provided by an embodiment of the present invention, a ratio of a circumference of each of the ring-shaped retaining walls to an arc length of the opening on the ring-shaped retaining walls is between 10 to 50.

In the display panel provided by an embodiment of the present invention, wherein a number of rings of the ring-shaped retaining walls is greater than or equal to 5.

Another embodiment of the present invention also provides a display device, including a display panel and a touch component, wherein the touch component is integrated in the display panel or disposed on the display panel, the touch component covers a display area and a peripheral area, the display panel includes an opening area, the peripheral area, and the display area, the peripheral area surrounds at least a part of the opening area, and the display panel further includes:
a thin film transistor substrate;
a plurality of ring-shaped retaining walls disposed on a part of the thin film transistor substrate corresponding to the peripheral area, and disposed around the opening area, wherein any one of the ring-shaped retaining walls is provided with at least an opening; and
a filling layer disposed in the peripheral area.

In the display device provided by an embodiment of the present invention, the ring-shaped retaining walls include:
a first ring-shaped retaining wall including at least one first opening and surrounding the opening area; and a second ring-shaped retaining wall including at least one second opening and surrounding the first ring-shaped retaining wall, wherein at least a part of the second opening corresponds to the first opening, or the second opening and the first opening are staggered to each other.

In the display device provided by an embodiment of the present invention, a ring-shaped groove is defined between adjacent ones of the ring-shaped retaining walls, and the ring-shaped retaining walls and the ring-shaped groove are communicated with each other through the opening.

In the display device provided by an embodiment of the present invention, the ring-shaped retaining walls has a T-shaped cross-section.

In the display device provided by an embodiment of the present invention, an angle formed between an inclined surface of the ring-shaped groove and a vertical direction of the ring-shaped groove is greater than 90 degrees and less than 180 degrees.

In the display device provided by an embodiment of the present invention, the thin film transistor substrate includes:
a substrate;
a buffer layer disposed on the substrate;
a switch component disposed in the display area and including an active layer, a first gate, a source, and a drain;
an insulating layer disposed in the display area and the peripheral area and at least including a first gate insulating layer and an interlayer insulating layer which are disposed on the active layer; and
a passivation layer covering the insulating layer.

In the display device provided by an embodiment of the present invention, the ring-shaped retaining walls are formed by patterning the passivation layer and the insulating layer.

In the display device provided by an embodiment of the present invention, a ratio of a circumference of each of the ring-shaped retaining walls to an arc length of the opening on the ring-shaped retaining walls is between 10 to 50.

In the display device provided by an embodiment of the present invention, a number of rings of the ring-shaped retaining walls is greater than or equal to 5.

Further another embodiment of the present invention also provides a method of manufacturing a display panel, wherein the display panel includes an opening area, a peripheral area and a display area, the peripheral area surrounds at least a part of the opening area, and the method of manufacturing the display panel includes the following steps:

A: forming a thin film transistor substrate;
B: forming a protective layer and a photoresist layer in sequence, wherein the protective layer and the photoresist layer are disposed on parts of the thin film transistor substrate corresponding to the display area and the peripheral area;
C: forming a plurality of ring-shaped retaining walls on the part of the thin film transistor substrate corresponding to the peripheral area and around the opening area, wherein any one of the ring-shaped retaining walls is provided with at least an opening; and
D: peeling off the photoresist layer and the protective layer;
E: forming a light-emitting functional layer on the part of the thin film transistor corresponding to the display area; and
F: forming a filling layer in the peripheral area.

In the method of manufacturing the display panel provided by an embodiment of the present invention, in the step C, the ring-shaped retaining walls include:
a first ring-shaped retaining wall including at least one first opening and surrounding the opening area; and
a second ring-shaped retaining wall including at least one second opening and surrounding the first ring-shaped retaining wall,
wherein at least a part of the second opening corresponds to the first opening, or the second opening and the first opening are staggered to each other.

Embodiments of the present invention provides a display device, a display panel, and a manufacturing method thereof. In the display panel provided by the present invention, a plurality of ring-shaped retaining walls with openings are arranged in a peripheral area of the display panel to improve the phenomenon of uneven coating caused by gas accumulation in the ring-shaped grooves when coating the filling layer.

In addition, in an embodiment of the present invention, the plurality of ring-shaped retaining walls in the peripheral area can extend an intrusion path of water and oxygen, and improve the stability of the display panel.

Further, each of the ring-shaped grooves between the ring-shaped retaining walls is set in an inverted T shape, which can effectively block the lateral invasion of water and oxygen and prevent the water and oxygen from damaging the display panel.

BRIEF DESCRIPTION OF DRAWINGS

FIG. 6 is a flow chart of steps of a method of manufacturing a display panel provided by an embodiment of the present invention.

DETAILED DESCRIPTION OF PREFERRED EMBODIMENTS

Figure 1:
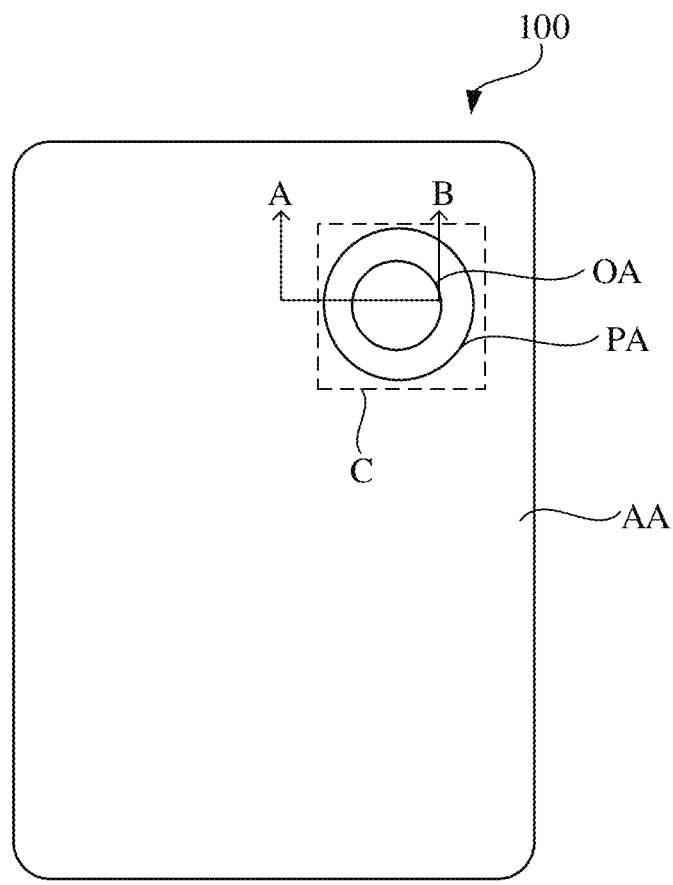
FIG. 1 is a top view of a display panel provided by an embodiment of the present invention.

In order to make the objectives, technical solutions, and advantages of the present invention clearer, the present invention will be described in further detail below Referring to the accompanying drawings. Referring to the drawings, wherein the same reference symbols represent the same elements. The following description is based on the specific embodiments of the present invention, which should not be construed as limiting other specific embodiments of the present invention that are not detailed herein. The term "embodiment" used in this specification means an example, instance, or illustration.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of this application, it should be noted that the terms "installation", "connected", and "connected" should be understood in a broad sense unless explicitly stated and limited otherwise. For example, it can be a fixed connection, a detachable connection, or an integral connection: it can also be a mechanical connection or an electrical connection: it can be a direct connection; or it can be an indirect connection through an intermediate medium: or it can be a communication between two components.

Figure 2:
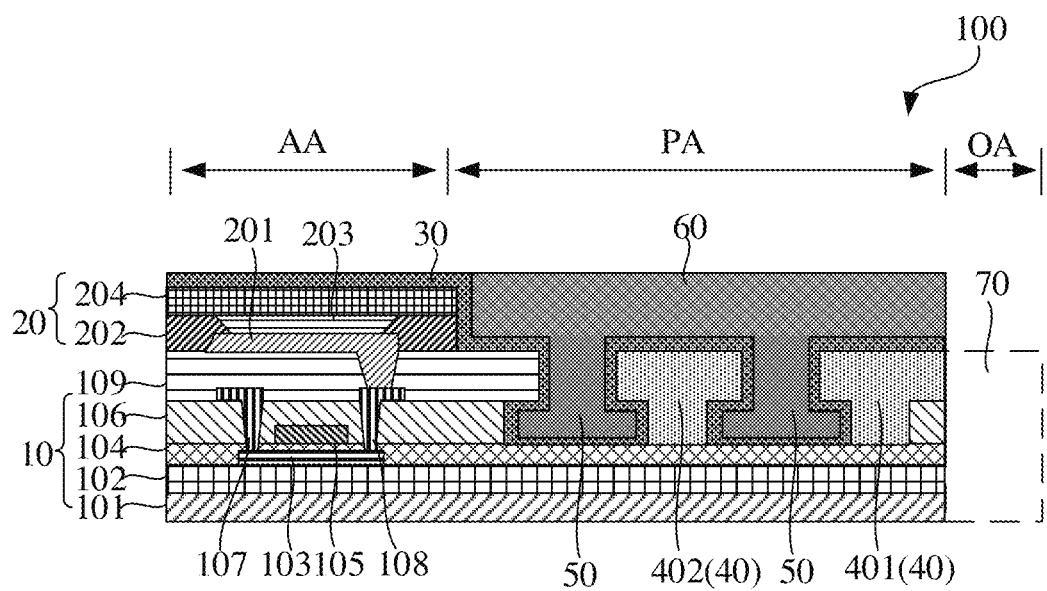
FIG. 2 is a cross-sectional view taken along the line A-B of FIG. 1.

Referring to FIG. 1 and FIG. 2, FIG. 1 is a top view of a display panel provided by an embodiment of the present invention, and is a cross-sectional view taken along the line A-B of FIG. 1. An embodiment of the present invention provides a display panel. The display panel 100 includes an opening area OA, a peripheral area PA, and a display area AA. The peripheral area PA surrounds at least a part of the opening area OA. The opening area OA is provided with a through hole 70 which is configured to set up a component such as a camera, earpiece or microphone. The opening area OA has, but is not limited to, a circular shape. For example, the opening area may has a shape including a quadrangle, triangle, or ellipse. As shown in FIG. 2, the display panel 100 further includes a thin film transistor substrate 10, a plurality of ring-shaped retaining walls 40 and a filling layer 60, wherein the ring-shaped retaining walls 40 is disposed at a portion of the thin film transistor substrate 10 corresponding to the peripheral area PA, the ring-shaped retaining walls 40 is disposed around the opening area OA, and any ring-shaped retaining walls 40 is provided with at least one opening. The filling layer 60 is disposed in the peripheral area PA.

Figure 4:
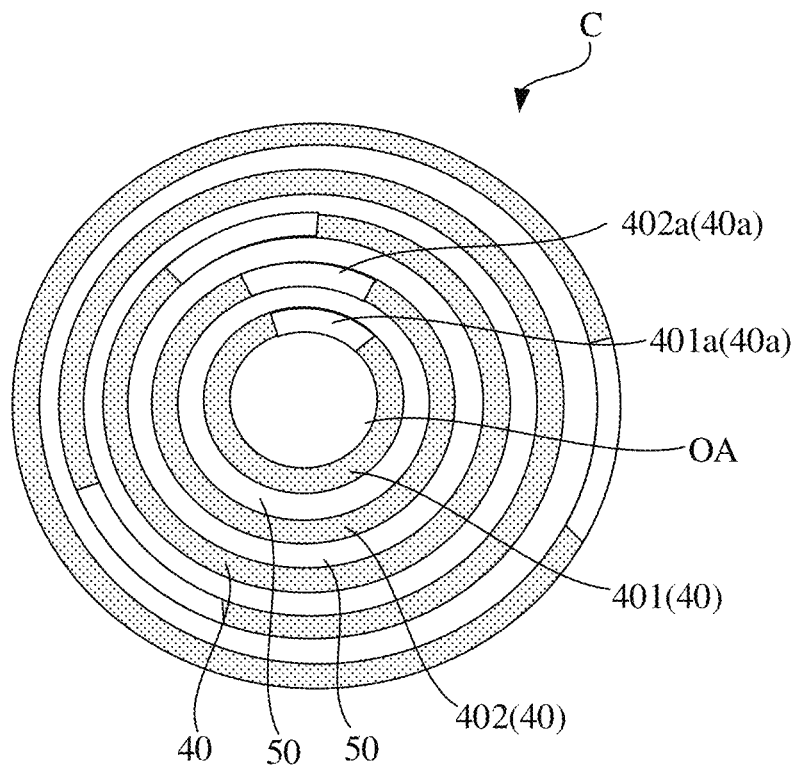
FIG. 4 is a schematic diagram of the area C in FIG. 1.

Referring to FIG. 2 and FIG. 4, FIG. 4 is a schematic diagram of area C in FIG. 1. A ring-shaped groove 50 is defined between adjacent ones of the ring-shaped retaining walls 40, and the ring-shaped retaining walls 40 and the ring-shaped groove 50 are communicated with each other through an opening 40a. In addition, the filling layer 60 fills the ring-shaped groove 50 and covers the ring-shaped retaining walls 40. Material of the filling layer 60 includes but is not limited to an organic filler. In an embodiment of the present invention, the organic filler is configured to fill the ring-shaped groove 50, so that the peripheral area PA has a higher flatness. In order to improve the uniformity of the filling layer 60, the filling layer 60 in an embodiment of the present invention may be formed by multiple coatings.

Specifically, still referring to FIG. 2, the thin film transistor substrate 10 includes a substrate 101, a buffer layer 102, a switch component, an insulating layer, and a passivation layer 109, wherein the buffer layer 102 is arranged on the substrate 101: the switch component is arranged in the display area AA: the switch component includes an active layer 103, a first gate 105, a source 107, and a drain 108: the insulating layer is arranged in the display area AA and the peripheral area PA, the insulating layer includes at least a first gate insulating layer 104 and an interlayer insulating layer 106 disposed on the active layer 103; and the passivation layer 109 covers the insulating layer.

In an embodiment of the present invention, the substrate 101 includes a glass substrate or a flexible substrate. The buffer layer 102 is configured to prevent water and oxygen from penetrating through the substrate 101 to the structure above the buffer layer 102 to prevent damage to the display panel. Material of the buffer layer 102 includes but is not limited to silicon-containing oxide, silicon-containing nitride, or silicon-containing oxynitride. For example, the material of the buffer layer 102 includes at least one of SiOx, SiNx, or SiOxNy. The active layer 103 is disposed on the buffer layer 102. The active layer 103 includes an active layer made of indium gallium zinc oxide (IGZO), zinc tin oxide (ZTO), or indium tin zinc oxide (ITZO), or may be a low temperature polysilicon (LTPS) active layer. Material of each of the first gate 105, source 107, and drain 108 includes a metals, an alloy, of a nitride of silver (Ag), magnesium (Mg), aluminum (Al), tungsten (W), copper (Cu), nickel (Ni), chromium (Cr)), molybdenum (Mo), titanium (Ti), platinum (Pt), tantalum (Ta), neodymium (Nd) or scandium (Sc), or combinations thereof.

Optionally, the thin film transistor substrate 10 in an embodiment of the present invention may further include a second gate and a second gate insulating layer (not shown), wherein the second gate is located on the first gate insulating layer 104 and corresponds to the first gate 105: the second gate insulating layer covers the second gate and the first gate insulating layer 104. Material of each of the first gate insulating layer 104, the second gate insulating layer, and the interlayer insulating layer 106 in the embodiments of the invention includes one or any combination of silicon oxide, silicon nitride, or silicon oxynitride.

A light-emitting functional layer 20 is further disposed in the portion of the thin film transistor substrate 10 corresponding to the display area AA. The light-emitting functional layer 20 includes an anode layer 201, a pixel defining layer 202, a light-emitting layer 203, and a cathode layer 204. The pixel defining layer 202 has an opening. The light-emitting layer 203 is defined in the opening of the pixel defining layer 202. The anode layer 201 is electrically connected to the drain 108 through a via hole.

The display panel 100 further includes an encapsulation layer 30 disposed in the display area AA and the peripheral area PA. As shown in FIG. 2, the encapsulation layer 30 is located between the ring-shaped retaining walls 40 and the filling layer 60 and covers a part of the ring-shaped groove 50. The encapsulation layer 30 may be configured as a laminate structure of inorganic layers and an organic layer, that is, an inorganic layer, an organic layer, and an inorganic layer stacked in sequence, for encapsulating the display area AA and the peripheral area PA.

Referring to FIG. 4, the ring-shaped retaining walls 40 includes at least a first ring-shaped retaining wall 401 and a second ring-shaped retaining wall 402. The first ring-shaped retaining wall includes at least one first opening 401a, and the first ring-shaped retaining wall 401 surrounds the opening area AA. The second ring-shaped retaining wall 402 includes at least one second opening 402a, and the second ring-shaped retaining wall 402 surrounds the first ring-shaped retaining wall 401. At least a part of the second opening 402a corresponds to the first opening 401a, and this arrangement can shorten a gas discharge path and reduce the subsequent coating time. Alternatively, the second opening 402a and the first opening 401a are arranged staggered to each other, and this arrangement can extend the gas intrusion path and effectively block the intrusion of water and oxygen. It should be noted that the positions of the openings 40a of the adjacent ones of the ring-shaped retaining walls 40 in an embodiment of the present invention can be adjusted according to actual requirements.

The ring-shaped retaining walls 40 is formed by patterning the passivation layer 109 and the insulating layer. For example, the ring-shaped retaining walls 40 is formed by etching the passivation layer 109 and the interlayer insulating layer 106, and bottom surfaces of the formed ring-shaped retaining walls 40 are located on the first gate insulating layer 104. In this case, the ring-shaped groove 50 has an undercut structure. Alternatively, the ring-shaped retaining walls 40 may also be formed by etching the passivation layer 109, the interlayer insulating layer 106, and the first gate insulating layer 104.

Further, a cross-sectional shape of each of the ring-shaped retaining walls 40 includes but is not limited to a T-shape. The cross-sectional shape of each of the ring-shaped retaining walls 40 is set to a T shape, so that a cross-section of the ring groove 50 located between adjacent ones of the ring-shaped retaining walls 40 has an inverted T shape. Such setting method can not only extend the water and oxygen intrusion path, but also effectively block the lateral invasion of water and oxygen. Optionally, the shape of the cross-section of each of the ring-shaped retaining walls 40 may also include any one of rectangle, semicircle, circle, triangle or ellipse.

Figure 3:
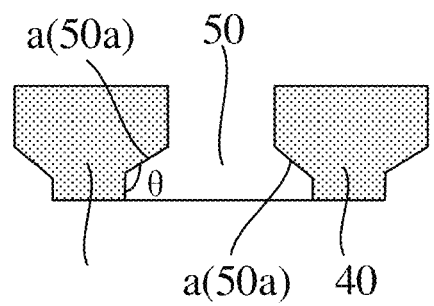
FIG. 3 is a schematic diagram of the ring-shaped retaining walls and the ring-shaped groove of the display panel provided by an embodiment of the present invention.

Optionally, the cross-section of each of the ring-shaped retaining walls 40 in an embodiment of the present invention may also include another shape. As shown in FIG. 3, each of the ring-shaped retaining walls 40 is set to has a shape of an irregular polygon. The irregular polygonal ring-shaped retaining wall 40 has an inclined surface a, so an angle formed between an inclined surface 50a of the ring-shaped groove 50 and a vertical direction of the ring-shaped groove 50 is greater than 90 degrees and less than 180 degrees, which facilitates that when forming the filling layer 60, gas in the ring-shaped groove 50 is discharged along the inclined surface 50a, and prevents the gas from accumulating in the ring-shaped groove and causing uneven coating.

In the present invention, a number of rings of the ring-shaped retaining walls 40 is greater than or equal to 5. For example, still referring to FIG. 4, in one embodiment, the number of rings of the ring-shaped retaining walls 40 is 5, and any one of the ring-shaped retaining walls 40 is provided with an opening 40 a. Meanwhile, the openings 40a on adjacent ones of the ring-shaped retaining walls 40 can be arranged correspondingly or staggered to each other.

Figure 5:
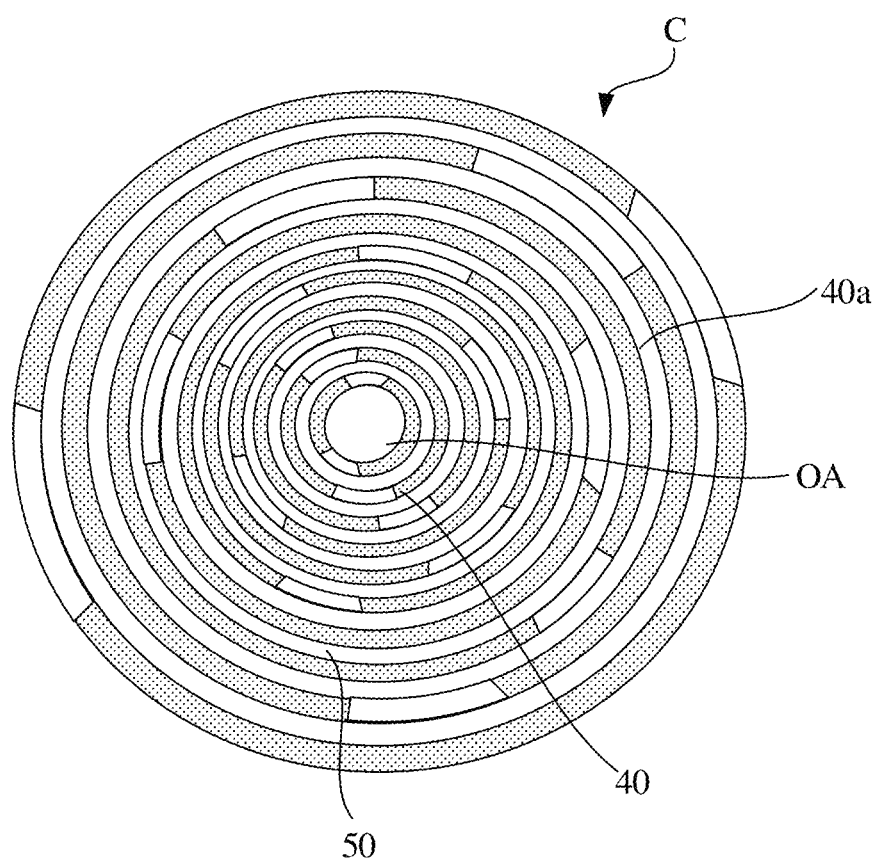
FIG. 5 is another schematic diagram of the area C in FIG. 1.

Referring to FIG. 5, FIG. 5 is another schematic diagram of the C area in FIG. 2. The number of rings of the ring-shaped retaining walls 40 can also be set to 10. Any one of the ring-shaped retaining walls 40 is provided with at least one opening 40a, and optionally, any one of the ring-shaped retaining walls 40 is provided with two openings 40a. Meanwhile, the openings of adjacent ones of the ring-shaped retaining walls 40 are preferably staggered to each other. The number of rings of the ring-shaped retaining walls 40 can also be set to 7 rings, 9 rings, 11 rings, 13 rings, or so on.

Referring to FIG. 4 or FIG. 5, a ratio of a circumference of each of the ring-shaped retaining walls 40 to an arc length of the opening 40a on the ring-shaped retaining walls 40 is between 10 to 50, which ensures that the ring-shaped retaining walls 40 can prevent the lateral invasion of water and oxygen, thus ensuring that the openings 40a on the ring-shaped retaining walls 40 play a role of exhausting gas.

An embodiment of the present invention also provides a method of manufacturing a display panel. Referring to FIGS. 1 and 2, the display panel 100 includes an opening area OA, a peripheral area PA, and a display area AA. The peripheral area PA surrounds at least a part of the opening area OA, wherein the opening area OA is provided with a through hole 70 which is configured to set up a component such as a camera, earpiece or microphone. Referring to FIG. 6, the method of manufacturing the display panel includes the following steps:

Step S1: forming a thin film transistor substrate.

Figure 7:
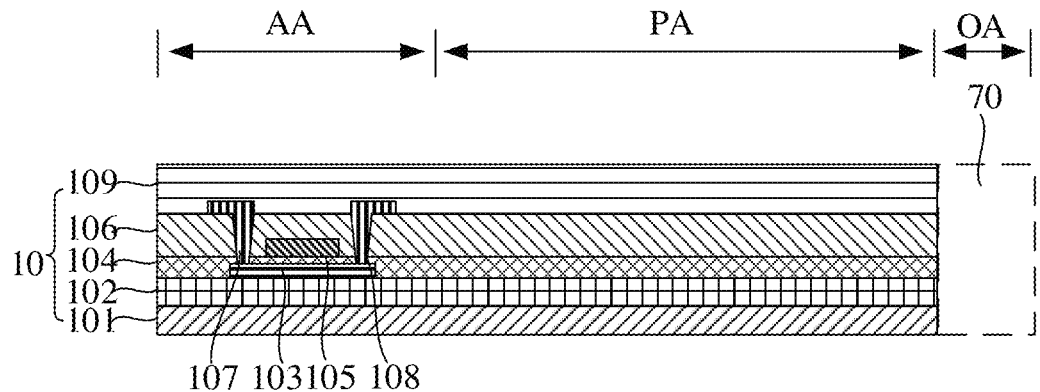
FIG. 7 to FIG. 11 are schematic structural diagrams of a method of manufacturing a display panel provided by an embodiment of the present invention.

Specifically, referring to FIG. 7, a buffer layer 102, a switch component, an insulating layer, and a passivation layer 109 are sequentially formed on the substrate 101, wherein the buffer layer 102 is arranged on the substrate 101: the switch component is arranged in the display area AA: the switch component includes an active layer 103, a first gate 105, a source 107, and a drain 108: the insulating layer is arranged in the display area AA and the peripheral area PA, the insulating layer includes a first gate insulating layer 104 and an interlayer insulating layer 106 disposed on the active layer 103; and the passivation layer 109 covers the insulating layer.

Step S2: forming a protective layer and a photoresist layer in sequence, wherein the protective layer and the photoresist layer are disposed on parts of the thin film transistor substrate corresponding to the display area and the peripheral area.

Figure 8:
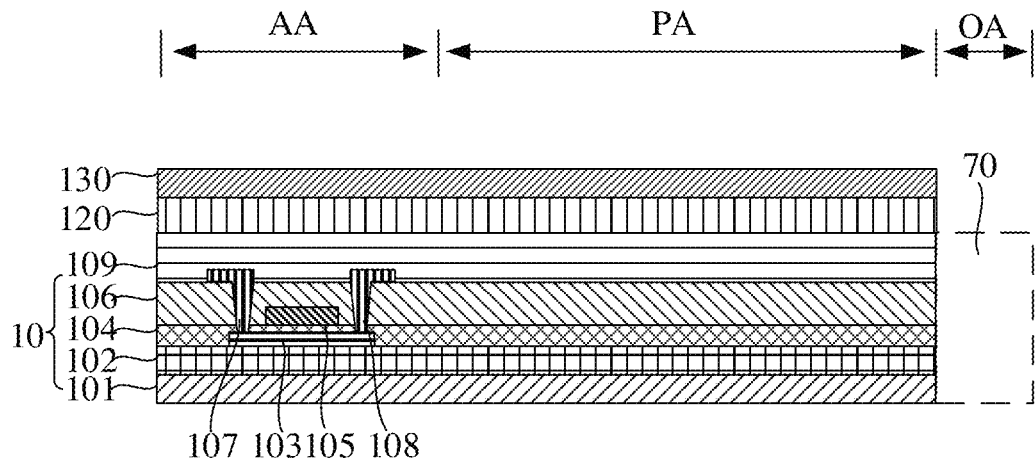

Specifically, referring to FIG. 8, a protective layer 120 and a photoresist layer 130 are formed on the thin film transistor substrate 10. Material of the protective layer 120 includes but is not limited to an inorganic material, such as silicon nitride, silicon oxide, silicon oxynitride, a metal oxide, or a metal, etc., the protective layer 120 is configured to protect the display area AA. The photoresist layer 130 includes, but is not limited to a photoresist material selected from any one of silicones and acrylics.

Step S3: forming a plurality of ring-shaped retaining walls on the part of the thin film transistor substrate corresponding to the peripheral area and around the opening area, wherein any one of the ring-shaped retaining walls is provided with at least an opening.

Figure 9:
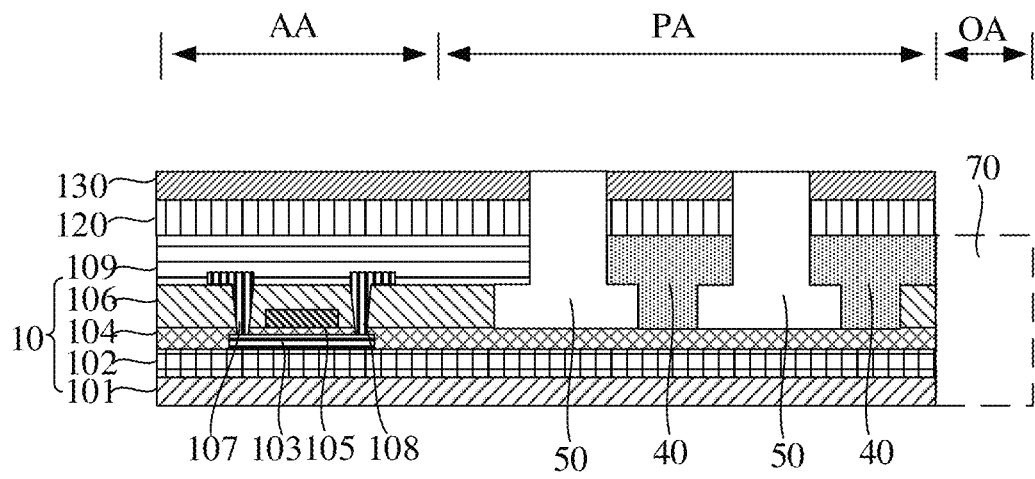

Referring to FIG. 9, the passivation layer 109 and the interlayer insulating layer 106 are etched to form ring-shaped retaining walls 40, and bottom surfaces of the formed ring-shaped retaining walls 40 are located on the first gate insulating layer 104. In this case, the ring-shaped groove 50 has an undercut structure. Alternatively, the ring-shaped retaining walls 40 may also be formed by etching the passivation layer 109, the interlayer insulating layer 106, and the first gate insulating layer 104. The ring-shaped groove 50 is the etched part.

Step S4: peeling off the photoresist layer and the protective layer.

Figure 10:
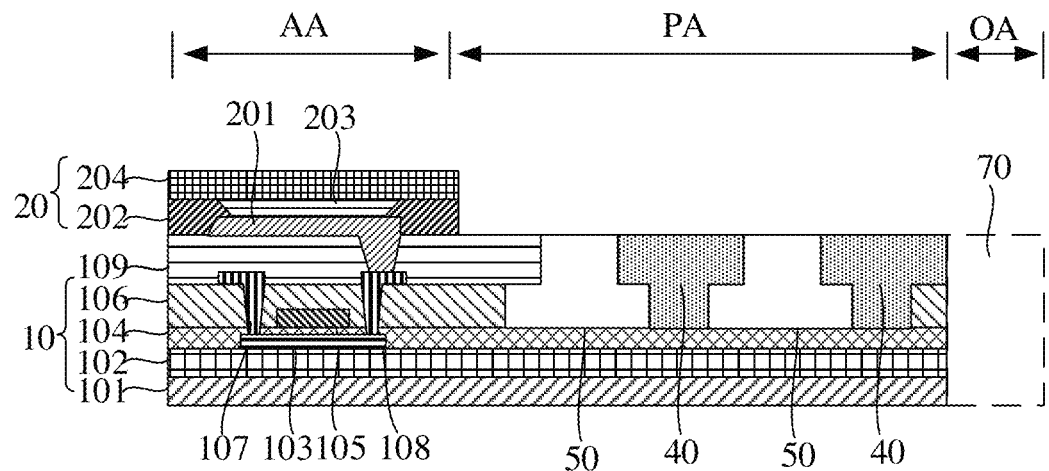

Referring to FIG. 10, the photoresist layer 120 and the protective layer 130 are peeled off.

Step S5: forming a light-emitting functional layer on the part of the thin film transistor corresponding to the display area.

Still referring to FIG. 10, the light-emitting functional layer 20 is formed on the passivation layer 109 and includes an anode layer 201, a pixel defining layer 202, a light-emitting layer 203, and a cathode layer 204. The pixel defining layer 202 has an opening. The light-emitting layer 203 is defined in the opening of the pixel defining layer 202. The anode layer 201 is electrically connected to the drain 108 through a via hole.

Figure 11:
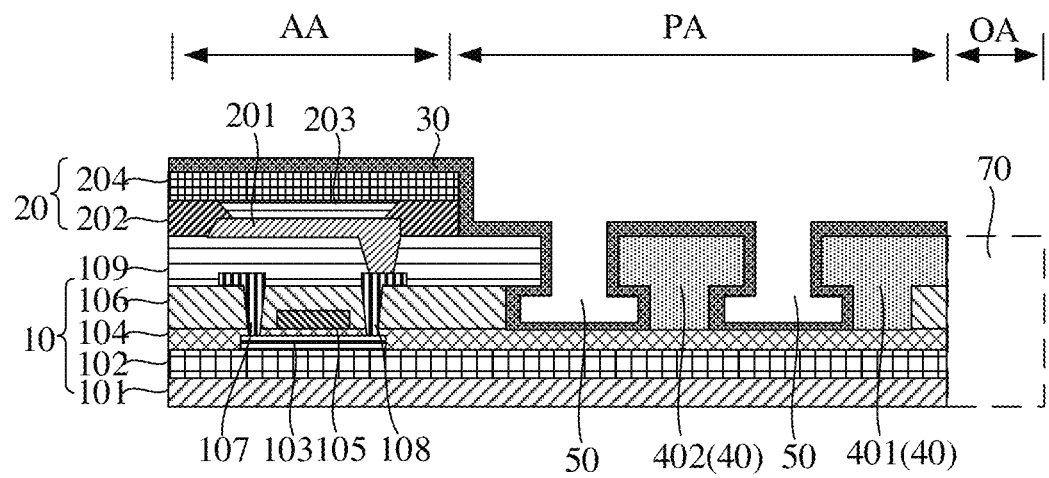

After the step S5, referring to FIG. 11, the method also includes: forming an encapsulation layer 30, which is located between the ring-shaped retaining walls 40 and the filling layer 60 and covers a part of the ring-shaped groove 50. The encapsulation layer 30 may be configured as a laminate structure of inorganic layers and an organic layer, that is, an inorganic layer, an organic layer, and an inorganic layer stacked in sequence, for encapsulating the display area AA and the peripheral area PA.

Step S6: forming a filling layer in the peripheral area.

Referring to FIG. 2, a filling layer 60 is formed in the peripheral area, and the filling layer 60 fills the ring-shaped groove 50 and covers the ring-shaped retaining walls 40, thus forming the display panel 100.

Figure 12:
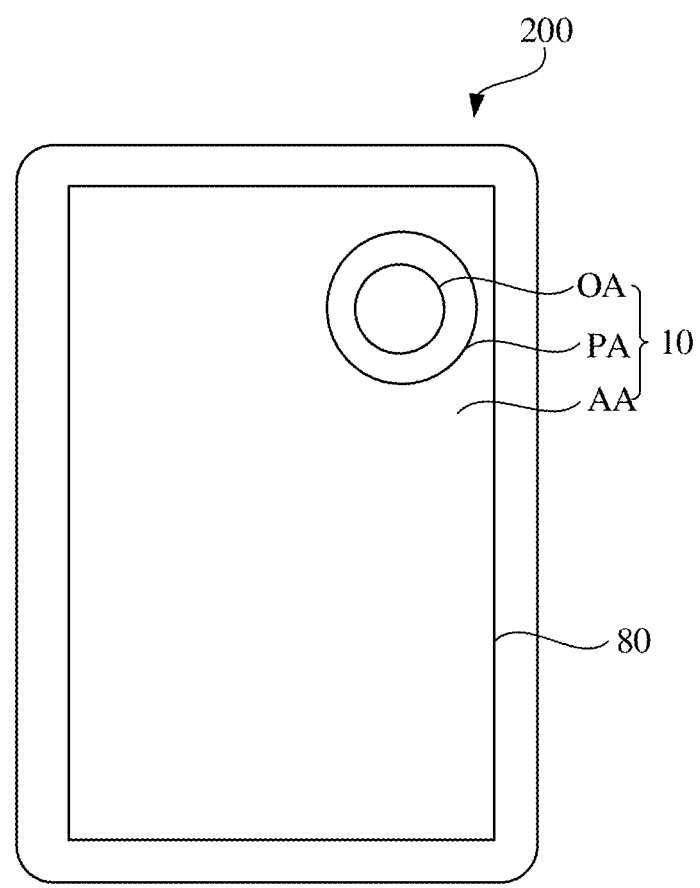
FIG. 12 is a schematic structural diagram of a display device provided by an embodiment of the present invention.

Referring to FIG. 12, an embodiment of the invention provides a display device. The display device 200 includes the above-mentioned display panel 100 and a touch component 80. The touch component 80 is integrated in the display panel or disposed on the display panel 100. The touch component 80 covers the display area AA and the peripheral area PA.

Embodiments of the present invention provides a display device, a display panel, and a manufacturing method thereof. In the display panel provided by the present invention, a plurality of ring-shaped retaining walls with openings are arranged in a peripheral area of the display panel to improve the phenomenon of uneven coating caused by gas accumulation in the ring-shaped grooves when coating the filling layer.

In addition, in an embodiment of the present invention, the plurality of ring-shaped retaining walls in the peripheral area can extend an intrusion path of water and oxygen, and improve the stability of the display panel.

Further, each of the ring-shaped grooves between the ring-shaped retaining walls is set in an inverted T shape, which can effectively block the lateral invasion of water and oxygen and prevent the water and oxygen from damaging the display panel.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising an opening area, a peripheral area surrounding at least a part of the opening area, and a display area, wherein the display panel further comprises:
    a thin film transistor substrate;
    a plurality of ring-shaped retaining walls disposed on a part of the thin film transistor substrate corresponding to the peripheral area, and disposed around the opening area, wherein each of the ring-shaped retaining walls is provided with one or more openings, ring-shaped grooves are defined between adjacent ones of the ring-shaped retaining walls, and the ring-shaped retaining walls and the ring-shaped grooves are communicating with each other through the openings; and
    a filling layer disposed in the peripheral area,
    wherein all of the ring-shaped grooves have a same depth.

2. The display panel according to claim 1, wherein the ring-shaped retaining walls comprise:
    a first ring-shaped retaining wall comprising at least one first opening and surrounding the opening area; and
    a second ring-shaped retaining wall comprising at least one second opening and surrounding the first ring-shaped retaining wall,
    wherein at least a part of the second opening corresponds to the first opening, or the second opening and the first opening are staggered to each other.

3. The display panel according to claim 1, wherein the ring-shaped retaining walls have a T-shaped cross-section.

4. The display panel according to claim 1, wherein an angle formed between an inclined surface of each of the ring-shaped grooves and a vertical direction of each of the ring-shaped grooves is greater than 90 degrees and less than 180 degrees.

5. The display panel according to claim 1, wherein the thin film transistor substrate comprises:
    a substrate;
    a buffer layer disposed on the substrate;
    a switch component disposed in the display area and comprising an active layer, a first gate, a source, and a drain;
    an insulating layer disposed in the display area and the peripheral area and at least comprising a first gate insulating layer and an interlayer insulating layer which are disposed on the active layer; and
    a passivation layer covering the insulating layer.

6. The display panel according to claim 5, wherein the ring-shaped retaining walls are formed by patterning the passivation layer and the insulating layer.

7. The display panel according to claim 1, wherein a ratio of a circumference of each of the ring-shaped retaining walls to an arc length of the openings on the ring-shaped retaining walls is between 10 to 50.

8. The display panel according to claim 1, wherein a number of rings of the ring-shaped retaining walls is greater than or equal to 5.

\* \* \* \* \*